United States Patent
Love et al.

[11] Patent Number: 5,897,341
[45] Date of Patent: Apr. 27, 1999

[54] DIFFUSION BONDED INTERCONNECT

[75] Inventors: David G. Love, Pleasanton; Larry L. Moresco, San Carlos, both of Calif.

[73] Assignee: Fujitsu Limited, Japan

[21] Appl. No.: 09/109,655

[22] Filed: Jul. 2, 1998

[51] Int. Cl.⁶ .......................... H01L 21/44; H01L 21/48; H01L 21/50
[52] U.S. Cl. .......................... 438/125; 428/106; 428/118
[58] Field of Search ..................................... 438/125, 118, 438/106

[56] References Cited

U.S. PATENT DOCUMENTS

| | | |
|---|---|---|
| 3,766,308 | 10/1973 | Loro . |
| 4,257,156 | 3/1981 | Houston . |
| 4,362,582 | 12/1982 | Danko . |
| 4,561,010 | 12/1985 | Ogihara et al. . |
| 4,837,928 | 6/1989 | Trevison et al. . |
| 4,842,662 | 6/1989 | Jacobi . |
| 4,948,031 | 8/1990 | De Clerck . |
| 5,017,738 | 5/1991 | Tsuji et al. . |
| 5,038,996 | 8/1991 | Wilcox et al. . |
| 5,186,379 | 2/1993 | Helber, Jr. . |
| 5,208,186 | 5/1993 | Mathew . |
| 5,222,014 | 6/1993 | Lin . |
| 5,242,099 | 9/1993 | Ueda . |
| 5,249,728 | 10/1993 | Lam . |
| 5,249,732 | 10/1993 | Thomas . |
| 5,276,955 | 1/1994 | Noddin et al. . |
| 5,409,157 | 4/1995 | Nagesh et al. . |
| 5,663,598 | 9/1997 | Lake et al. . |
| 5,749,997 | 5/1998 | Tang et al. ............................. 438/125 |

OTHER PUBLICATIONS

Lau, "Chip On Board Technologies for Multichip Modules," pp. 262–267, 1994.

*Primary Examiner*—Kevin M. Picardat
*Assistant Examiner*—Deven Coutos
*Attorney, Agent, or Firm*—Coudert Brothers

[57] ABSTRACT

A method of interconnecting integrated circuit chips to a substrate during the assembly of a multi-chip module. Instead of forming an electrical and physical bond by reflowing solder bumps attached to the pads of the chips and the substrate, as in flip-chip bonding, thin pads of specially selected dissimilar metals placed on the chips and substrate are connected by a solid-state diffusion bonding process. In one embodiment, the I/O pads on a chip are formed from aluminum or an aluminum alloy and are aligned and placed into physical contact with corresponding metal pads or metal layered pads on a substrate, where the metal is capable of being diffusion bonded to aluminum. The combination of chip(s) and substrate are then heated in a controlled atmosphere at a temperature and for a time sufficient to cause solid-state diffusion bonding to occur.

30 Claims, 1 Drawing Sheet

DIFFUSION BONDED INTERCONNECT

TECHNICAL FIELD

The present invention relates to methods of fabricating semiconductor devices, in particular multi-chip modules, and more specifically, to a method of forming an interconnect between an integrated circuit chip and a substrate by solid state diffusion bonding of dissimilar metals.

BACKGROUND OF THE INVENTION

Multi-chip modules (MCM) are substrates on which more than one integrated circuit chip is mounted. The substrate (e.g., a chip carrier) typically includes bonding pads for the chip, where the pads may be connected by a set of conductive lines to contact pads for a package or to other bonding pads on the substrate. The conductive lines thus form an interconnect network or I/O path for multiple elements mounted on a common substrate. Although there are other methods for electrically connecting an integrated circuit chip or other component to a substrate, the most commonly used ones are termed flip-chip bonding, wire bonding, and tape automated bonding (TAB).

In flip-chip (or solder bump) bonding, solder bumps are placed on the I/O pads of a chip and reflowed to form a bond with the chip pads. The chip is placed on a holder in a face-up position, flipped over (i.e., face-down) and aligned with the corresponding conductive bonding pads on the substrate. The chip pads and substrate pads are then brought into physical contact. The solder is reflowed by application of heat, causing the bumps to fuse with the bonding pads and provide both an electrical and structural connection between the chip's I/O pads and the substrate. In wire bonding processes, the chips are attached to the substrate in a face-up position and thin gold or aluminum wires are then connected between the I/O pads of the chip and the bonding pads of the substrate. The wires are connected to the two sets of pads by means of a thermocompression, thermosonic, or ultrasonic welding operation. In TAB bonding, the chips are attached to the substrate in a face-up position and the I/O pads of the chips are then bonded to metal pads on a polyimide film tape by either reflowing or thermocompression/ultrasonic bonding metal and/or solder bumps placed on the tape.

Each of the described methods for interconnecting chips to a substrate has its associated advantages and disadvantages. Flip-chip methods provide the highest density of I/O interconnects and therefore the capability of producing the smallest MCMs. The I/O connections may be made at the periphery of the chip or in its interior. The flip-chip bonds provide a good electrical connection, but the solder joints generally exhibit poor heat dissipation capability (low thermal conductivity). Another disadvantage is that the integrity of the solder joint between the pads can be reduced by thermally induced metal fatigue (differential thermal expansion between the components), and by corrosion caused by trapped solder flux or contaminants. Shorting between closely spaced bumps can occur when the solder is reflowed. In addition, because the solder must be heated to a sufficient temperature to cause it to reflow, flip-chip bonding may not be suited for use with some temperature sensitive components (i.e., components which are damaged, or have their electrical characteristics unacceptably altered when heated to solder reflow temperatures).

Wire bonding is a mature technology, however, the wires used in wire bonding are purposefully made very thin, thereby limiting the power they can transfer without failure. In addition, the lead inductance and resistance of the wires result in a degradation of the electrical performance of the interconnects. Wire bond connections have a larger footprint than flip-chip interconnects, and thus require a comparatively larger substrate than flip-chip bonded MCMs. The wires also form a relatively long signal propagation path compared to other interconnect methods. In addition, embrittlement of the interconnections as a result of the formation of intermettalics can cause a failure of the bonds (e.g., this is a problem between gold wirebonds and aluminum pads).

TAB interconnections offer the benefits of a smaller bonding pad and pitch than wire bonding. However, like wire bonding, TAB is limited to the interconnection of chips having perimeter I/O pads. This typically results in a lower overall I/O density than can be obtained using flip-chip technologies. TAB interconnects also generally have a higher capacitance and greater parasitic inductance than do flip-chip bonds. Finally, because TAB assembly usually requires different tooling for each chip design, TAB is a relatively expensive bonding method.

What is desired is a method for interconnecting integrated circuit chips to a substrate which overcomes some of the disadvantages of presently available methods, while retaining many of the benefits of those methods. It is particularly desired to have a method for interconnecting chips to a substrate which has the benefits of flip-chip bonding, without the drawbacks of that method.

SUMMARY OF THE INVENTION

The present invention is directed to a method of interconnecting integrated circuit chips to a substrate during the assembly of a multi-chip module. Instead of forming an electrical and physical bond by reflowing solder bumps attached to the pads of the chips and the substrate, as in flip-chip bonding, thin pads of specially selected dissimilar metals are formed on the chips and substrate and are connected by a solid-state diffusion bonding process. The I/O pads on a chip are typically formed from aluminum or an aluminum alloy. These pads are aligned and placed into physical contact with corresponding metal substrate pads or substrate pads on which a layer of a suitable metal has been formed, where the metal is capable of forming a solid phase diffusion bond with aluminum. The combination of chip(s) and substrate are then heated in a controlled atmosphere at a temperature sufficient to cause a solid state diffusion bond to form.

The interconnection method of the present invention is an alternative to existing methods which provides many of the benefits of those methods while overcoming many of the disadvantages. The length of the interconnection is shorter than that formed with other methods, providing a shorter signal propagation path. The diffusion bond exhibits good electrical characteristics, providing a low resistance, low impedance signal path. If aluminum is used for the bonding pads of the integrated circuit chips, the method requires fewer processing steps than other interconnection methods. This is because it is not necessary to perform additional processing of the integrated circuit chip (e.g., to form solder bumps as in flip-chip bonding), connect two ends of a thin wire (as in wire bonding), or fabricate and align a tape (as in TAB). The risk of electrical shorting between adjacent interconnections is reduced compared to flip-chip methods because no reflow of solder is required. This permits the use of a higher chip and substrate bonding pad density (and hence interconnect density) than is permitted when using other bonding methods. In addition, because the diffusion bond can be performed at a lower temperature than that required for solder reflow, the process is less likely to damage temperature sensitive components.

DETAILED DESCRIPTION OF THE PREFERRED EMBODIMENT

Figure 1:
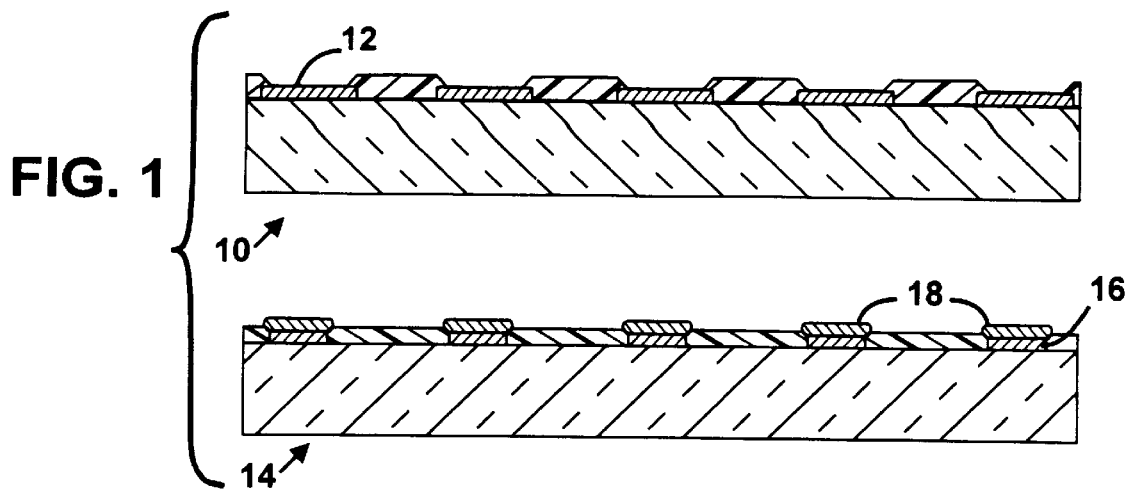
FIG. 1 is a side view of an integrated circuit chip having aluminum bonding pads and a substrate having bonding pads on which a layer of a metal has been formed which can be solid state diffusion bonded to the integrated circuit pad in accordance with the method of the present invention.

The present invention is a method for interconnecting integrated circuit chips to a substrate such as a chip carrier. The interconnect operation is one typically occurring during the fabrication of multi-chip modules (MCMs). Although the method is applicable in the general situation of connecting a chip to a substrate, it is preferable to use the invention in a situation in which there is a minimal strain applied to the interconnect during power cycling of the chips. This would occur in situations where the temperature differential across the interconnect is small, or where the substrate is constructed from a flexible material. Substrate materials having a low coefficient of thermal expansion (e.g., Aluminum Nitride) are also well suited to use with the other features of the present invention. The scenarios described act to limit the stress placed on the interconnect due to thermal coefficient of expansion mismatches between the joint and the materials on either side of the joint. A low power MCM, or one utilizing active cooling are thus examples of suitable situations for application of the present invention.

In such a situation of limited thermal stress, the structure of the interconnects can be made to be very short. This provides a shorter signal propagation path, and good electrical characteristics (low impedance, low resistance) compared to other bonding methods. The inventors of the present invention have recognized that the technique of solid-state (or solid-phase) diffusion bonding can be used to interconnect I/O pads on a chip to metal pads or metal-plated pads on a substrate to produce such a short interconnect structure. In order to determine which two dissimilar metals would be best for forming the diffusion bond on the interconnect structures of the present invention, the inventors recognized that several problems needed to be solved:

(1) the two metals should exhibit a high diffusion rate of one into the other at relatively low temperatures (e.g., 100–150 degrees centigrade). This permits the bond to be formed at temperatures which are low enough to prevent damage to the components, and also prevents significant thermal stress on the joint arising from differential expansion of the joint components;

(2) the joint composition should have a low eutectic point if rework of the joint is required; however, the bonding temperature should be lower than the liquidus temperature of the joint alloy;

(3) the joint composition can have a high eutectic point if rework of the joint is not required, or if it can be ensured that the stoichiometry and total quantities of bulk metals used to form the joint are far from the eutectic composition;

(4) the joint materials and bonding method should not form intermettalic compounds, thereby preventing embrittlement and the resulting high electrical resistance;

(5) the two materials should have a similar density—this prevents the swelling or shrinking of pads during the diffusion process, which can weaken the joint. A relative density between the two materials within a factor of four is preferable, and a relative density on the order of two is desirable;

(6) the joint materials should have a relatively low electrical resistance, e.g., no more than 10 times that of copper;

(7) in order to minimize the physical size of the MCMs, the total thickness of the joint should be minimized (e.g., less than one micron); and (8) the metals should be capable of being used in conventional semiconductor and electrical packaging processing equipment.

Of the requirements resulting from consideration of the above problems, that of the two metals having a high diffusion rate of one into another and the requirement of having sufficiently similar densities are specific and substantially unique to the pad-to-pad electrical interconnect of the present invention. Such requirements are not of concern to the solder-bump, wire-bonding, and TAB-bonding interconnect technologies, which are the dominant fixed-interconnection technologies of the electrical packaging industry.

After considered investigation of numerous metal-to-metal combinations in view of the above requirements, of which there are well over a thousand, the inventors have discovered that the following metal-metal combinations meet the above requirements for the pad-to-pad interconnect and diffusion bonding process of the present invention: aluminum to cadmium, aluminum to gallium, aluminum to nickel, aluminum to tin, and aluminum to zinc. For the combinations investigated, the inventors studied the metallurgic phase diagrams of the combinations for eutectic points, liquidus points, and intermetallic compounds, and studied the diffusivities, the densities, and the electrical resistivities. It is noted that at least the following metal-metal interactions cannot be predicted by the atomic structures of the two metals: (1) the eutectic point of two metals, (2) the liquidus point of a two-metal alloy, (3) the number of intermetallic compounds of the two metals and their conditions of formation, and (4) the diffusivities of the two metals into one another.

While aluminum is commonly used for interconnect pads on IC chips, the inventors are not aware of the use of cadmium or solid gallium interconnect pads in IC chip packaging technologies. An alloy of gallium and indium is sometimes used as a liquid solder at 20 degrees centigrade. Thin nickel layers or thin zinc layers are sometimes plated onto pads to provide better wetting to solder during solder reflow processes. While aluminum is commonly used for IC chip pads, and while copper is commonly used for electrical traces in interconnect substrates, these two commonly used metals are not useful as a combination in the present invention due to the high number of intermetallic combinations formed by these two metals, and due to their low diffusion rate into one another. In the interconnect structures of the prior art, these metals are electrically coupled to one another through solder material, which is usually in the form of a single solder bump which separates the two metals.

When practicing the invention, a layer of substantially pure aluminum (>95% by weight) is formed over each bonding pad of one component, if the bonding pads of the component are not already formed from aluminum. A layer of substantially pure metal (>95% by weight) of either cadmium, gallium, nickel, tin, or zinc is formed over each bonding pad of the other component. These layers may be formed in any of the conventional layer formation methods (e.g., evaporation, sputtering, CVD, plating). Due to its low-cost, plating is currently preferred. Several electroplating methods and electroless plating methods (and corresponding baths) are well known to those of skill in the art.

FIG. 1 is a side view of an integrated circuit chip 10 having aluminum bonding pads 12 and a substrate 14 having bonding pads 16 on which a layer of a metal 18 has been formed which can be solid state diffusion bonded to the integrated circuit pad in accordance with the method of the present invention. Note that in FIG. 1, bonding pads 16 are shown as being recessed below the surface of substrate 14. In such a situation, layer 18 is formed having a thickness sufficient to cause the final solid state diffusion bond to have the desired thickness. Although the substrate pads are shown as recessed in the figure, it is understood that pads 16 are not required to be recessed in order to practice the present invention, and that any suitable combination of recessed or unrecessed substrate pads and/or integrated circuit pads may be used in practicing the present invention.

The formed metal layer and the aluminum bonding (e.g., I/O) pads of the chip to be mounted onto the substrate are then cleaned to facilitate the bonding process. The I/O pads of the chip are then placed in proper alignment with the substrate pads in the X, Y, Z, and rotational axes. This can be accomplished using a flip-chip bonding machine. Such a machine typically includes a chuck, a moveable assembly platform, and a split-field viewer. When bonding a chip to a chip carrier or substrate, for example, the substrate is placed on the chuck in a face-up position, and the chip is placed on the moveable platform in a face-up position. The platform is then rotated 180 degrees so that the chip is face-down. The chip is then moved into coarse alignment with the substrate, but separated from it by several millimeters. The split-field viewer is interposed between the chip and the substrate, and is used to provide the user with simultaneous views of the chip and the substrate. Using these views, the user aligns the pads of the chip with the corresponding plated bonding pads of the substrate. Typically, each of the two components to be bonded has cross-hair alignment marks which are used for this precise alignment. Note that instead of using a split-field viewer, the components may be aligned by making precise measurements of the position of one of the components in space (i.e., with respect to the X, Y, and Z axes) and then moving the other component into proper alignment.

Figure 2:
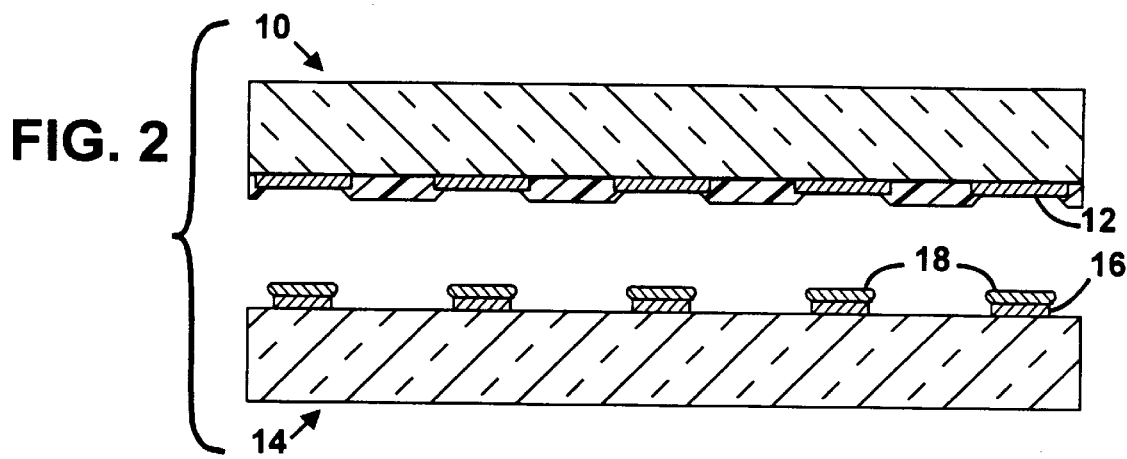
FIG. 2 is a side view showing how the bonding pads of the integrated circuit chip and the metal layered pads of substrate of FIG. 1 are aligned in accordance with the method of the present invention.

FIG. 2 is a side view showing how bonding pads 12 of integrated circuit chip 10 and the metal layered pads of substrate 14 of FIG. 1 are aligned in accordance with the method of the present invention. For components having sufficiently large bonding pads with sufficiently large separation distances, other alignment methods may be used. These other methods include performing the alignment by hand or by automatic placement equipment.

Once the pads of chip and the substrate are correctly aligned, the split-field viewer is retracted and the assembly platform holding the chip is lowered to bring the chip's pads into physical contact with the substrate's plated bonding pads. A solid-state diffusion bonding operation is then carried out. This involves applying the appropriate temperature and pressure to the bond sites to cause solid-state interdiffusion of the two materials to occur. Depending upon the metals involved, a typical diffusion operation would include heating the aligned chips and substrate to a temperature of 100–150 degrees centigrade for a sufficient time to form a solid-state (phase) diffusion bond (e.g., one hour). This forms a bonding joint which electrically connects the chip to the substrate. As noted, the substrate or integrated circuit chip may have pads which are recessed, sometimes by as much as 0.5 microns. In such a situation, sufficient metal may be formed on each substrate pad (e.g, by plating) to produce a metal layer having a height of approximately 1 micron (i.e., approximately 0.5 microns above the surface of the substrate in the case of recessed substrate pads) prior to forming the solid state diffusion bond. This will cause the final interconnect structure to be of the desired size.

Figure 3:
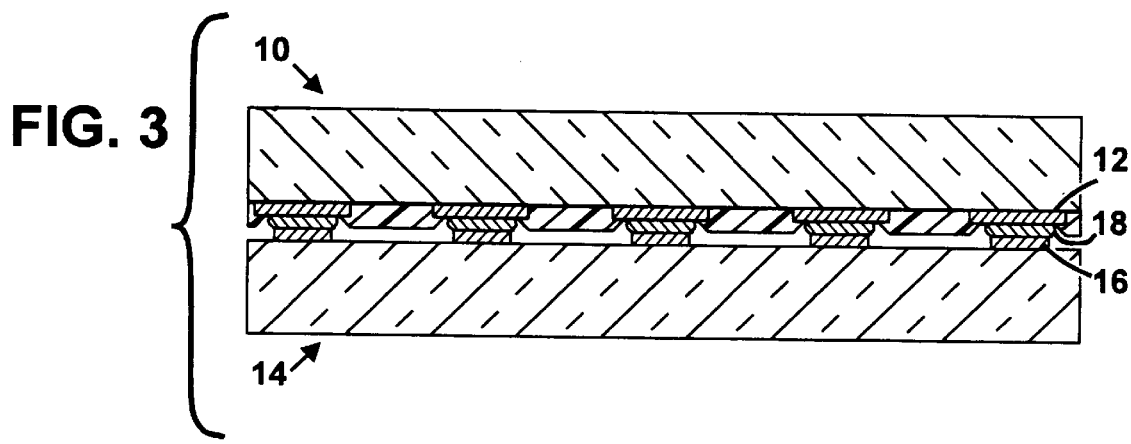
FIG. 3 is a side view showing the bonding pads of the integrated circuit chip and the metal layered pads of substrate of FIG. 2 placed into physical contact and solid state diffusion bonded in accordance with the method of the present invention.

As noted, after properly aligning the plated substrate pads to the chip's pads and placing the respective pads in physical contact, the combination should be heated in a controlled (neutral or reducing) atmosphere to a temperature of 150 degrees centigrade for sufficient time to form a solid-state diffusion bond (approximately 30 minutes in the case of Aluminum-Cadmium and Aluminum-Tin, and approximately 45 minutes to an hour for the other metal-metal combinations). The resulting solid-state interdiffusion of the two metals forms a solid metallic bond. Such a solid state diffusion bond is characterized by having at least 10 atomic monolayers of intermixed atoms. A liquidus state will not occur because the eutectic point of the mixture is much higher than 150 degrees centigrade (321 degrees centigrade in the case of an aluminum-cadmium system). The bonded parts should then be allowed to cool to room temperature (approximately 25 degrees centigrade) in a controlled atmosphere where the bonds remain in a solid state. The bonded components can then be subjected to any remaining assembly steps. The metallic bonds are electrically conductive and act as metallic conductors. (It is noted that while Cadmium is known to form a semiconductor when mixed with Mercury and Tellurium, it does not form a semiconductor with Aluminum.) FIG. 3 is a side view showing bonding pads 12 of integrated circuit chip 10 and metal layered 18 pads 16 of substrate 14 of FIG. 2 placed into physical contact and solid state diffusion bonded in accordance with the method of the present invention.

The described process for interconnecting an integrated circuit chip to a substrate has many advantages over currently available methods. It does not require any additional processing of the integrated circuit chips, thus reducing the cost compared to methods requiring the formation of special structures (e.g., solder balls). Because solid-state diffusion bonding can be performed at relatively low temperatures, temperature induced damage to chips or substrates can be avoided. The inventive method produces shorter interconnects having good electrical characteristics, and joints which are not as subject to the corrosion problem as flip-chip bonds. If a flexible substrate is used in practicing the invention, the interconnects should also be less subject to thermally induced metal fatigue than flip-chip bonds.

Although the invention has been described in the context of assembling a multi-chip module, it is also applicable to other fabrication processes. For example, it could be used for the array bonding of infra red detectors or flat panel displays.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

What is claimed is:

1. A method of fabricating a semiconductor device, comprising:
   providing a component having an aluminum bonding pad;
   providing a substrate having a bonding pad;
   forming a layer comprising Cadmium over the substrate bonding pad;
   aligning the component aluminum bonding pad to the substrate bonding pad;
   bringing the component aluminum bonding pad into physical contact with the substrate bonding pad; and
   forming a solid-state diffusion bond between the component aluminum bonding pad and the substrate bonding pad.

2. The method of claim 1, wherein the step of aligning the component aluminum bonding pad to the substrate bonding pad further comprises:
   interposing a split-field viewer between the component and the substrate; and
   using the split-field viewer to align the component aluminum bonding pad to the substrate bonding pad.

3. The method of claim 1, wherein the step of forming a solid-state diffusion bond between the component aluminum bonding pad and the substrate bonding pad further comprises:
   heating the physically contacted component bonding pad and substrate bonding pad at a temperature substantially between 100 and 150 degrees centigrade for a sufficient period of time to form a solid-state diffusion bond.

4. The method of claim 1, wherein the component is an integrated circuit chip.

5. A method of fabricating a semiconductor device, comprising:
   providing a component having an aluminum bonding pad;
   providing a substrate having a bonding pad;
   forming a layer comprising Gallium over the substrate bonding pad;
   aligning the component aluminum bonding pad to the substrate bonding pad;
   bringing the component aluminum bonding pad into physical contact with the substrate bonding pad; and
   forming a solid-state diffusion bond between the component aluminum bonding pad and the substrate bonding pad.

6. The method of claim 5, wherein the step of aligning the component aluminum bonding pad to the substrate bonding pad further comprises:
   interposing a split-field viewer between the component and the substrate; and
   using the split-field viewer to align the component aluminum bonding pad to the substrate bonding pad.

7. The method of claim 5, wherein the step of forming a solid-state diffusion bond between the component aluminum bonding pad and the substrate bonding pad further comprises:
   heating the physically contacted component bonding pad and substrate bonding pad at a temperature substantially between 100 and 150 degrees centigrade for a sufficient period of time to form a solid-state diffusion bond.

8. The method of claim 5, wherein the component is an integrated circuit chip.

9. A method of fabricating a semiconductor device, comprising:
   providing a component having an aluminum bonding pad;
   providing a substrate having a bonding pad;
   forming a layer comprising Nickel over the substrate bonding pad;
   aligning the component aluminum bonding pad to the substrate bonding pad;
   bringing the component aluminum bonding pad into physical contact with the substrate bonding pad; and
   forming a solid-state diffusion bond between the component aluminum bonding pad and the substrate bonding pad.

10. The method of claim 9, wherein the step of aligning the component aluminum bonding pad to the substrate bonding pad further comprises:
    interposing a split-field viewer between the component and the substrate; and
    using the split-field viewer to align the component aluminum bonding pad to the substrate bonding pad.

11. The method of claim 9, wherein the step of forming a solid-state diffusion bond between the component aluminum bonding pad and the substrate bonding pad further comprises:
    heating the physically contacted component bonding pad and substrate bonding pad at a temperature substantially between 100 and 150 degree centigrade for a sufficient period of time to form a solid-state diffusion bond.

12. The method of claim 9, wherein the component is an integrated circuit chip.

13. A method of fabricating a semiconductor device, comprising:
    providing a component having an aluminum bonding pad;
    providing a substrate having a bonding pad;
    forming a layer comprising Tin over the substrate bonding pad;
    aligning the component aluminum bonding pad to the substrate bonding pad;
    bringing the component aluminum bonding pad into physical contact with the substrate bonding pad; and
    forming a solid-state diffusion bond between the component aluminum bonding pad and the substrate bonding pad.

14. The method of claim 13, wherein the step of aligning the component aluminum bonding pad to the substrate bonding pad further comprises:
    interposing a split-field viewer between the component and the substrate; and
    using the split-field viewer to align the component aluminum bonding pad to the substrate bonding pad.

15. The method of claim 13, wherein the step of forming a solid-state diffusion bond between the component aluminum bonding pad and the substrate bonding pad further comprises:
    heating the physically contacted component bonding pad and substrate bonding pad at a temperature substantially between 100 and 150 degree centigrade for a sufficient period of time to form a solid-state diffusion bond.

16. The method of claim 13, wherein the component is an integrated circuit chip.

17. A method of fabricating a semiconductor device, comprising:

provid ing a component having an aluminum bonding pad;

providing a substrate having a bonding pad;

forming a layer comprising Zinc over the substrate bonding pad;

aligning the component aluminum bonding pad to the substrate bonding pad;

bringing the component aluminum bonding pad into physical contact with the substrate bonding pad; and forming a solid-state diffusion bond between the component aluminum bonding pad and the substrate bonding pad.

18. The method of claim 17, wherein the step of aligning the component aluminum bonding pad to the substrate bonding pad further comprises:

interposing a split-field viewer between the component and the substrate; and using the split-field viewer to align the component aluminum bonding pad to the substrate bonding pad.

19. The method of claim 17, wherein the step of forming a solid-state diffusion bond between the component aluminum bonding pad and the substrate bonding pad further comprises:

heating the physically contacted component bonding pad and substrate bonding pad at a temperature substantially between 100 and 150 degree centigrade for a sufficient period of time to form a solid-state diffusion bond.

20. The method of claim 17, wherein the component is an integrated circuit chip.

21. A method of fabricating a semiconductor device, comprising:

providing a component having an aluminum bonding pad;

providing a substrate having a bonding pad;

forming a layer comprising an element selected from the group consisting of Cadmium, Gallium, Nickel, Tin, and Zinc over the substrate bonding pad;

aligning the component aluminum bonding pad to the substrate bonding pad;

bringing the component aluminum bonding pad into physical contact with the substrate bonding pad; and forming a solid-state diffusion bond between the component aluminum bonding pad and the substrate bonding pad.

22. The method of claim 21, wherein the step of aligning the component aluminum bonding pad to the substrate bonding pad further comprises:

interposing a split-field viewer between the component and the substrate; and using the split-field viewer to align the component aluminum bonding pad to the substrate bonding pad.

23. The method of claim 21, wherein the step of forming a solid-state diffusion bond between the component aluminum bonding pad and the substrate bonding pad further comprises:

heating the physically contacted component bonding pad and substrate bonding pad at a temperature substantially between 100 and 150 degree centigrade for a sufficient period of time to form a solid-state diffusion bond.

24. The method of claim 21, wherein the component is an integrated circuit chip.

25. The method of claim 3, wherein the step of heating the physically contacted component bonding pad and substrate bonding pad further comprises:

heating the physically contacted pads for a period of time between approximately 30 minutes and one hour.

26. The method of claim 7, wherein the step of heating the physically contacted component bonding pad and substrate bonding pad further comprises:

heating the physically contacted pads for a period of time between approximately 30 minutes and one hour.

27. The method of claim 11, wherein the step of heating the physically contacted component bonding pad and substrate bonding pad further comprises:

heating the physically contacted pads for a period of time between approximately 30 minutes and one hour.

28. The method of claim 15, wherein the step of heating the physically contacted component bonding pad and substrate bonding pad further comprises:

heating the physically contacted pads for a period of time between approximately 30 minutes and one hour.

29. The method of claim 19, wherein the step of heating the physically contacted component bonding pad and substrate bonding pad further comprises:

heating the physically contacted pads for a period of time between approximately 30 minutes and one hour.

30. The method of claim 23, wherein the step of heating the physically contacted component bonding pad and substrate bonding pad further comprises:

heating the physically contacted pads for a period of time between approximately 30 minutes and one hour.

* * * * *